US008637909B1

(12) United States Patent
Vorhaus

(10) Patent No.: US 8,637,909 B1
(45) Date of Patent: Jan. 28, 2014

(54) MIXED MODE DUAL SWITCH

(75) Inventor: James L. Vorhaus, Chapel Hill, NC (US)

(73) Assignee: Sarda Technologies, Inc., Durham, NC (US)

(*) Notice: Subject to any disclaimer, the term of this patent is extended or adjusted under 35 U.S.C. 154(b) by 51 days.

(21) Appl. No.: 13/442,313

(22) Filed: Apr. 9, 2012

Related U.S. Application Data

(63) Continuation-in-part of application No. 13/364,258, filed on Feb. 1, 2012, which is a continuation-in-part of application No. 13/270,145, filed on Oct. 10, 2011, now Pat. No. 8,274,121, which is a continuation of application No. 13/205,433, filed on Aug. 8, 2011, now Pat. No. 8,519,916.

(60) Provisional application No. 61/372,513, filed on Aug. 11, 2010.

(51) Int. Cl.
*H01L 29/78* (2006.01)

(52) U.S. Cl.
USPC ............... 257/288; 257/E29.127; 257/289; 257/401; 438/197

(58) Field of Classification Search
USPC .............. 257/E21.431, E27.111, E29.127, 257/E29.151, 76, 279, 288, 289, 347, 401; 438/284, 286, 301, 487; 323/282, 283; 345/55, 76
See application file for complete search history.

(56) References Cited

U.S. PATENT DOCUMENTS

| | | | | |
|---|---|---|---|---|
| 8,274,121 | B2* | 9/2012 | Vorhaus | 257/401 |
| 8,344,464 | B2* | 1/2013 | Cho | 257/401 |
| 8,426,952 | B2* | 4/2013 | Cho et al. | 257/666 |
| 8,497,574 | B2* | 7/2013 | Cho et al. | 257/676 |
| 8,519,916 | B2* | 8/2013 | Vorhaus | 345/76 |

* cited by examiner

*Primary Examiner* — Chris Chu
(74) *Attorney, Agent, or Firm* — Carr & Ferrell LLP

(57) ABSTRACT

Various aspects of the technology provide for a converter circuit such as a dc-dc voltage converter or buck converter. The circuit includes a enhancement mode control Field Effect Transistor (FET) fabricated using gallium arsenide and an depletion mode sync FET fabricated using gallium arsenide. A drain of the sync FET may be coupled to a source of the control FET and an inductor may be coupled to the source of the control FET and the drain of the sync FET.

29 Claims, 7 Drawing Sheets

Prior Art     FIG. 1A

MIXED MODE DUAL SWITCH

CROSS REFERENCE TO RELATED APPLICATIONS

This application is a continuation in part of U.S. patent application Ser. No. 13/364,258, filed Feb. 1, 2012 and titled SELF CLAMPING FET DEVICES IN CIRCUITS USING TRANSIENT SOURCES," which in turn is a continuation in part of U.S. patent application Ser. No. 13/270,145, filed Oct. 10, 2011 now U.S. Pat. No. 8,274,121 and titled "COMPOUND FIELD EFFECT TRANSISTOR WITH MULTI-FEED GATE AND SERPENTINE INTERCONNECT," which is a continuation of Ser. No. 13/205,433, filed Aug. 8, 2011 now U.S. Pat. No. 8,519,916, and titled "LOW INTERCONNECT RESISTANCE INTEGRATED SWITCHES," which claims the priority benefit of U.S. provisional application No. 61/372,513, filed Aug. 11, 2010, and titled "Field Effect Transistor and Method of Making Same." The above referenced applications are hereby incorporated by reference in their entirety.

TECHNICAL FIELD

The present invention relates to semiconductors devices, and more particularly to compound semiconductor Field Effect Transistor switches and power FETs used in DC-DC converters.

BACKGROUND

A common type of Field Effect Transistors (FET) is a Metal-Oxide-Semiconductor Field Effect Transistor (MOSFET), which may be fabricated using silicon. As is known to those of ordinary skill in the art, a typical circuit application for a MOSFET device is a synchronously-rectified step-down (buck) DC-DC converter output stage. A DC-DC converter functions to "step-down" a DC voltage. For example, a power supply may provide 12V DC and a component (e.g., processor or other semiconductor device) may require 1V DC. In this situation a DC-DC converter may be interposed between the power supply and component to provide the required voltage. The basic operation of a buck converter is known to those of ordinary skill in the art.

The inductor in a buck converter can discharge current back into the MOSFET device(s) when not supplied with power. Silicon MOSFET devices include an intrinsic body diode that is useful for blocking current surges from an inductor. Unfortunately, body diodes also consume power and increase the size and cost of the devices. Additional diodes may be used to supplement current blocking inherent in the body diode of a MOSFET. Unfortunately additional diodes increase the cost of a circuit. A compound semiconductor FET such as a GaAs FET is generally not used in rectified step-down (buck) DC-DC converter circuits or other circuits that include transient sources such as inductors because a GaAs FET does not include an intrinsic body diode for blocking current surges. While a diode may be included in a compound semiconductor FET during fabrication of the device this is an unattractive alternative due to increased cost, complexity and size. Similarly diodes used in the circuit design increases cost and parts count.

SUMMARY

Generally described, an embodiment of the present invention utilizes two compound semiconductors arranged to provide power conversion. In one embodiment, a first embodiment of the invention first and second Field Effect Transistors (FETs) are fabricated using or gallium nitride. The drain of the first FET (called the sync FET) is connected to the source of the second FET (called the control FET). The first and second FETs may be enhancement or depletion mode devices, as described below.

Various embodiments of a converter circuit comprise a depletion mode control Field Effect Transistor (FET) fabricated using gallium arsenide and an enhancement mode sync FET fabricated using gallium arsenide. A drain of the sync FET may be coupled to a source of the control FET and an inductor may be coupled to the source of the control FET and the drain of the sync FET. The control FET and the sync FET may be disposed on a single piece of gallium arsenide. In some embodiments, the converter circuit is configured as a buck converter circuit. The sync FET may be configured to clamp voltage at the drain of the sync FET independent of a clamping diode between the source and the drain of the sync FET.

In addition to the above embodiment where the control FET is depletion mode and the synch FET is an enhancement mode device, another embodiment may provide a control FET configured as an enhancement mode device, a source of the control FET coupled to the inductor; and a sync FET configured as a depletion mode device. The control FET and the sync FET may be fabricated using a single compound semiconductor substrate. A drain of the sync FET may be coupled to the inductor and the source of the control FET. In some embodiments, a channel between the drain and a source of the sync FET is configured to clamp voltage from the inductor independent of a clamping diode. In some embodiments, the sync FET is configured without a clamping diode between the source and the drain of the sync FET. A driver circuit may be configured to switch the sync FET off before switching the control FET on upon power-up of the converter circuit.

Various aspects of a method for fabricating a converter circuit method comprise fabricating a control FET as an enhancement mode device on a compound semiconductor layer and fabricating a sync FET as a depletion mode device on the compound semiconductor layer with the control FET. A contact may be coupled to a source of the control FET and to a drain of the sync FET, the contact may be configured for coupling to an inductor. In some embodiments, a driver circuit may be coupled to a gate of the control FET and a gate of the sync FET, the driver circuit configured to switch the sync FET off upon powering up the converter circuit before switching the control FET on.

BRIEF DESCRIPTION OF THE DRAWINGS

FIG. 1A is a block diagram illustrating a prior art (buck) DC-DC converter output stage using a blocking diode.

DETAILED DESCRIPTION

A compound semiconductor FET device presents a device possessing improved performance. In various embodiments, a compound semiconductor FET device may be fabricated on substrates including GaAs, Silicon Carbide, silicon, aluminum nitride, gallium nitride, sapphire, and/or the like. Performance advantages that this device can deliver may be extracted from the operation of the device in a variety of applications, including but not limited to an application such as the power switch(es) in a synchronously-rectified DC-DC buck converter and other circuits. As described below in one preferred embodiment, a compound semiconductor FET fabricated as a depletion mode device may be used to clamp transient signals. Drive signal levels and timing of the device(s) in a synchronous buck converter application may be selected to prevent cross-conduction/shoot-through of the power switches without the use of intrinsic or extrinsic diodes to block surges from transient sources. While an example of a synchronously-rectified DC-DC buck converter is presented, a depletion mode compound semiconductor FET may be used to clamp transient signals in other circuits, and as described below enhancement or depletion mode compound semiconductors may be used.

Figure 1B:
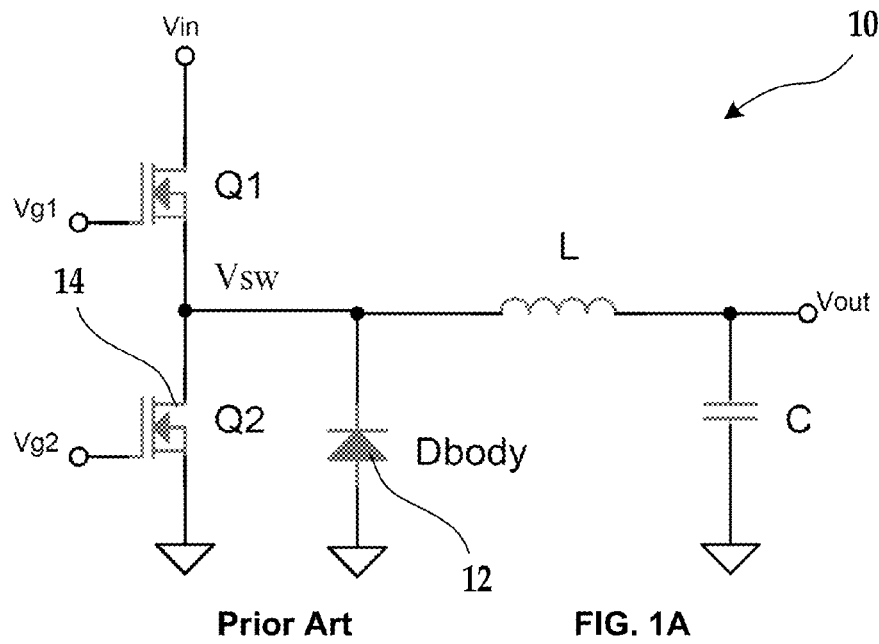
FIG. 1B illustrates a block diagram of a circuit for a synchronously-rectified power stage using a compound semiconductor FET, in accordance with embodiments of the invention.
Figure 1B:
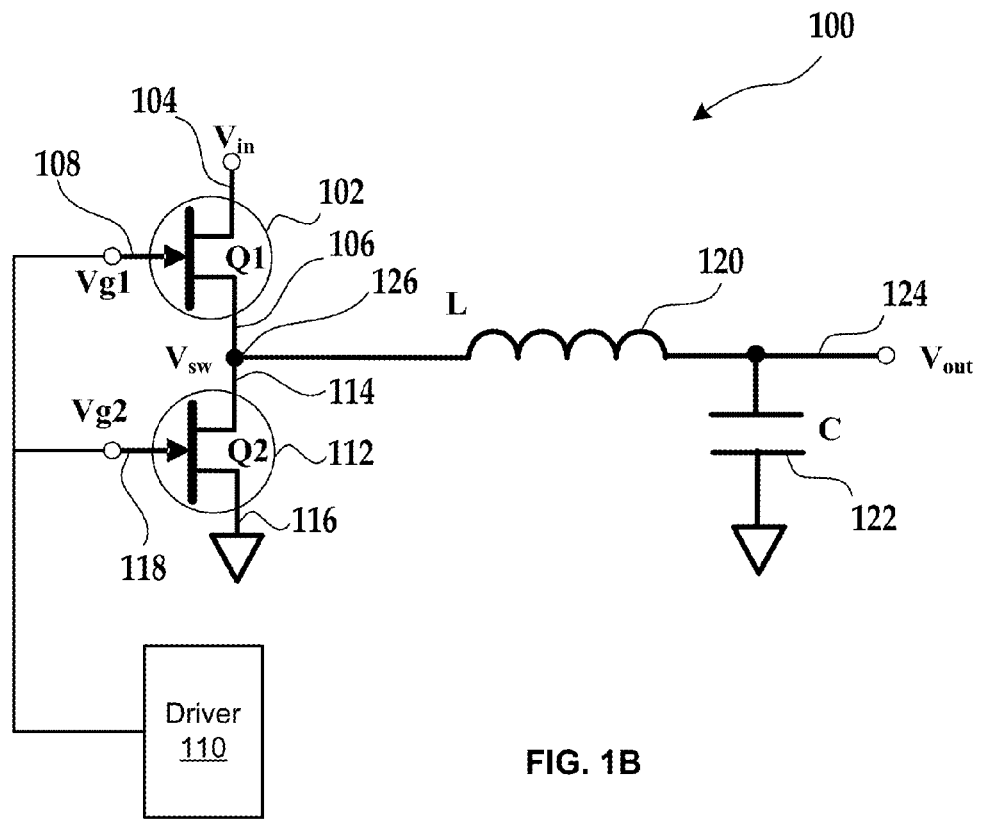
Figure 2:
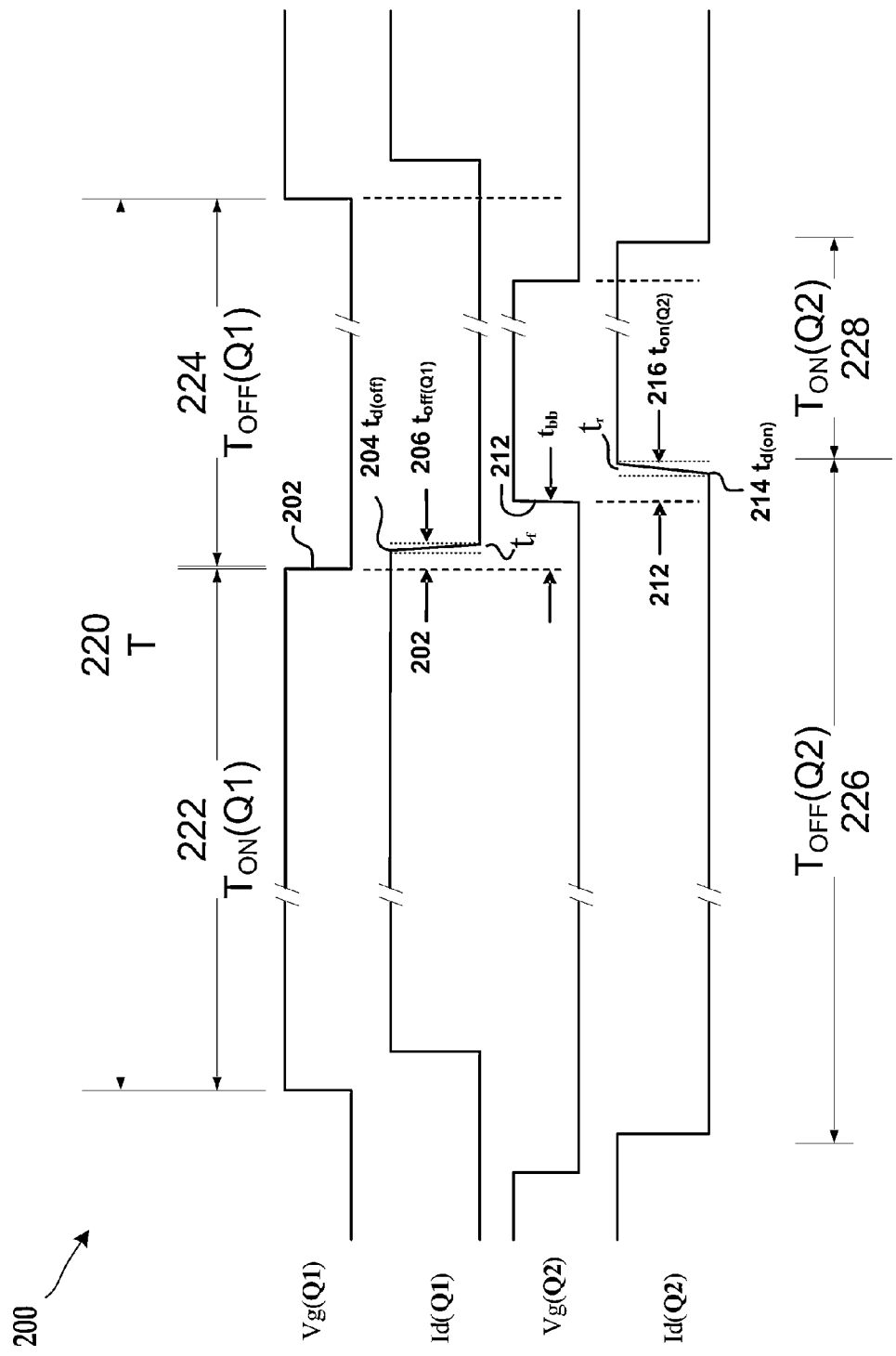
FIG. 2 illustrates a timing diagram for the circuit of FIG. 1B.

FIG. 1B illustrates a block diagram of a circuit 100 for a synchronously-rectified power stage using a compound semiconductor FET, in accordance with embodiments of the invention. FIG. 2 illustrates a timing diagram 200 for the circuit 100 of FIG. 1B. The power stage circuit 100 of FIG. 1B includes a synchronously rectified step-down (buck) DC-DC converter output stage. The circuit 100 includes a control FET 102 (Q1) and a compound semiconductor FET used as a sync FET 112 (Q2). In various embodiments, the sync FET 112 is a depletion mode device fabricated using compound semiconductor material including gallium arsenide (GaAs), gallium nitride (GaN), and/or the like. In some embodiments, the control FET 102 is also a compound semiconductor FET. The control FET 102 and/or the sync FET 112 may be a depletion mode device or an enhancement mode device. That is, in various embodiments, the control FET 102 is a depletion mode device and the sync FET 112 is a depletion mode device; the control FET 102 is an enhancement mode device and the sync FET 112 is a depletion mode device; the control FET 102 is a depletion mode device and the sync FET 112 is an enhancement mode device; or the control FET 102 is an enhancement mode device and the sync FET 112 is an enhancement mode device.

The circuit 100 further includes an inductor 120 (L) and a capacitor 122 (C). A drain 114 of the sync FET 112 may be coupled to the inductor 120 and a source 106 of the control FET 102. A source 116 of the sync FET 112 may be coupled to ground. A drain 104 of the control FET 102 may be coupled to an input voltage $V_{in}$. The inductor 120, drain 114 and source 106 may be coupled at a switching node 126.

A gate 118 of the sync FET 112 and a gate 108 of the control FET 102 may be coupled to a driver 110. The driver 110 is configured to apply a gate voltage $V_{g1}$ to the gate 108 of control FET 102 (e.g., turn the sync FET 102 on and off), and to apply a gate voltage $V_{g2}$ to the gate 118 of the sync FET 112 (e.g., turn the control FET 102 on and off) according to exemplary timing illustrated in FIG. 2. The sync FET 112 of FIG. 1B is a depletion mode device configured for a gate pinch off voltage at about −1.0V, a gate full OFF voltage at about −2V, and a gate full ON voltage at about +0.4V, with respect to the source 116. However, the sync FET 112 may be configured for other pinch OFF voltages, ON voltages, and/or OFF voltages.

The output voltage $V_{out}$ at node 124 of circuit 100 may be determined from the duty cycle (ON time of control FET 102) from equation 1:

$$V_{out} = D * V_{in} \qquad \text{Eq. 1}$$

Where D is the duty cycle of the converter, defined in equation 2 as:

$$D = \frac{T_{ON(Q1)}}{T} \qquad \text{Eq. 2}$$

Where $T_{ON(Q1)}$ is the period of time 222 that control FET 102 is on, and T is the period of time 220 the clock is utilized. In some embodiments, $V_{in}$ may be about 12V and $V_{out}$ may be about 1 volt. A time interval of interest is the time interval just after control FET 102 is turned OFF at time 202 and just prior to when sync FET 112 is turned ON at time 212, the beginning of the time interval (1−T), as shown in FIG. 2. Thus, an interval between Q1(ON) and Q2(ON) is a switching interval that may be selected to prevent turning both the control FET 102 and the sync FET 112 on simultaneously, as will be recognized by one of ordinary skill in the.

During the ON time interval 222 of control FET 102, time $T_{ON(Q1)}$, the drain current of control FET 102, which is $I_d(Q1)$ flows through control FET 102 into the inductor L. The driver 110 may send a signal to command the gate voltage $V_g(Q1)$ at gate 108 for control FET 102 to an OFF state at time 202. In response, drain current $I_d(Q1)$ may begin to switch to an OFF state at time $t_{d(OFF)}$, or time 204. After a fall time of $t_f$ the drain current $I_d(Q1)$ through the control FET 102 into the inductor is at an OFF state at time $t_{OFF(Q1)}$, or time 206.

After a delay, the driver 110 may send a signal to command the gate voltage $V_g(Q2)$ at gate 118 for sync FET 112 to an ON state at time 212. In response, the sync FET 112 may begin to switch to an ON state at $t_{d(ON)}$, or time 214. As the sync FET 112 switches to an ON state, current begins to flow through the sync FET 112. After a rise time of $t_r$, the drain current $I_d(Q2)$ through the sync FET 112 is in an ON state at time $t_{ON(Q2)}$, or time 216.

Two time intervals are of special interest at this point. A time interval $t_{bb}$ is a delay time between time 202 and time 212, and is a delay time that may be inserted between switching OFF the control FET 102 at time 202 and switching ON the sync FET 112 at time 212 so as to avoid an uncontrolled cross-conduction of current from $V_{in}$ directly to ground through control FET 102 and sync FET 112. A time interval $t_{dt}$, which may also be referred to as the dead time, is a time when both the control FET 102 and sync FET 112 are off between time 206 and time 214. During the time $t_{dt}$ at uncontrolled voltage transients from the inductor 120 may cause damage to the circuit 100.

A compound semiconductor FET does not have an intrinsic drain-source body diode as found in silicon MOSFET devices. Thus, the time interval $t_{dt}$ is of interest. During time $t_{dt}$, both control FET 102 and sync FET 112 are OFF and the inductor 120 may expose the drain of the sync FET 112 to excessive reverse, and potentially destructive, voltage. If the sync FET 112 were provisioned using a silicon MOSFET as illustrated in FIG. 1A, a body diode 12 such as is intrinsically present in silicon MOSFET devices, such as device 14, would serve to provide protection from voltage transients produced by the inductor 120 during $t_{dt}$ at by clamping such negative voltage transients to the forward voltage of the body diode. However, a compound semiconductor FET such as sync FET 112 illustrated in FIG. 1B does not have a body diode.

In a preferred embodiment of the present invention, circuit 100 may use a sync FET 112 that is fabricated as a depletion mode device using compound semiconductor materials. Such sync FET 112 may be used without a diode in the circuit and without a diode fabricated into the device. The depletion mode, compound semiconductor sync FET 112 may nonetheless prevent deleterious, uncontrolled voltage or current conditions that occur in circuits having transients, such as circuit 100 during the time interval $t_{dt}$. There exists a voltage clamping property that occurs in compound semiconductor FET devices that may be used instead of a MOSFET in switching circuit designs that include transient sources, such as inductor 120 of the circuit 100. A circuit may be designed to use the voltage clamping property of the compound semiconductor sync FET 112, instead of the body diode of a MOSFET, to protect a circuit from breakdown or damage resulting from transients generated, for example, in the inductor 120 of circuit 100. Thus, for example, sync FET 112 of circuit 100 may be a depletion mode device fabricated from compound semiconductor materials, and configured to clamp transient voltages from the inductor 120.

Figure 3:
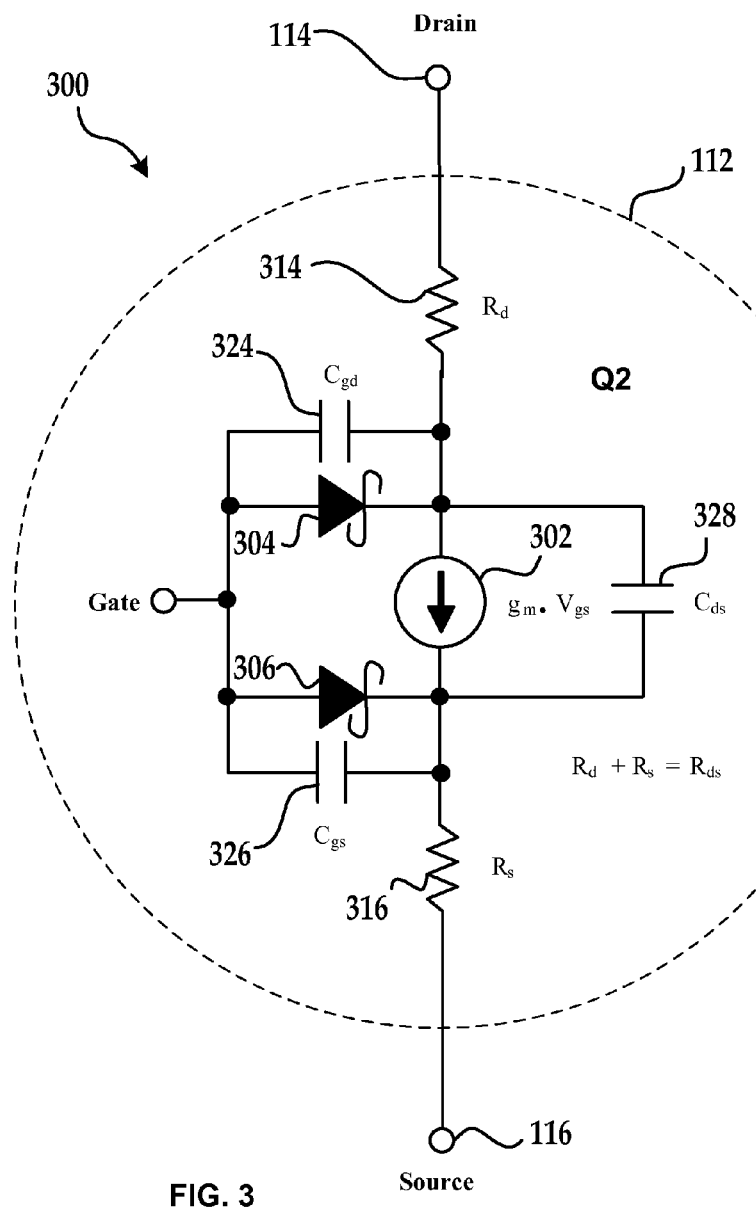
FIG. 3 is a circuit model illustrating details of an embodiment of the sync FET of FIG. 1B.
Figure 4:
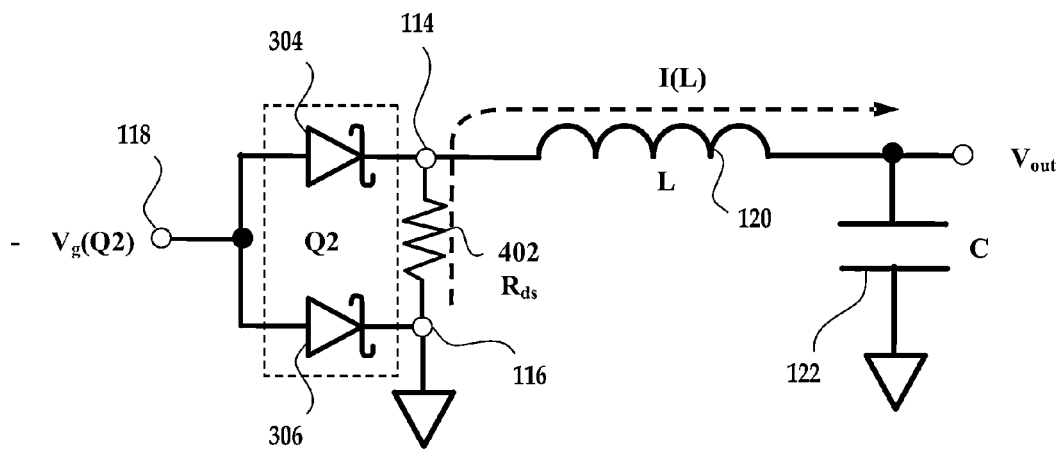
FIG. 4 illustrates details of a portion of the circuit of FIG. 1B showing portions of the circuit model of FIG. 3.

FIG. 3 is a circuit model 300 illustrating details of an embodiment of the sync FET 112 of FIG. 1B. FIG. 4 illustrates details of a portion of the circuit 100 of FIG. 1B showing portions of the circuit model 300 of FIG. 3. A look at the inter-electrode model of the sync FET 112 may aid in further understanding the circuit operation of the sync FET 112. The model 300 for sync FET 112 illustrated in FIG. 3 includes a channel 302, a drain Schottky diode 304, a source Schottky diode 306, a drain resistor 314 (Rd), and a source resistor 316 (Rs). Referring to FIG. 4, a drain-source resistor 402 ($R_{ds}$) may be equivalent to a sum of the drain resistor 314 and the source resistor 316. That is, $R_{ds}=R_d+R_s$. When the sync FET 112 is in an ON state, resistance of the drain-source resistor 402 $R_{ds(ON)}$ may be very low, for example, about 0.01 Ohms. FIG. 4 illustrates a direction of the current I(L) during the OFF state of the control FET 102 when the drain 114 of the sync FET 112 (Q2) is at a negative voltage and sync FET 112 is either clamping the voltage at the drain 114 or in an ON state.

Referring again to FIG. 3, the model 300 further includes a gate drain capacitor 324, a gate source capacitor 326, and a drain source capacitor 328. The channel 302 may be represented by the drain-source resistor 402 in FIG. 4. The resistance between the drain 114 and the source 116 depends on voltage at the gate 118 with reference to the source 116. As the channel 302 resistance of the drain-source resistor 402 decreases, it forms a reasonably low resistance path for the negative current to flow to ground, and provides for self-clamping of the voltage across the channel 302. Voltage is described in an algebraic sense. Thus, for example, −4 volts is less than −2 volts, and +2 volts is greater than −4 volts.

During the time interval 226 that sync FET 112 is turned off, the gate 118 of circuit 100 is held at the potential $V_g$, which is a potential less than the pinch off voltage ($V_p$), which is about −1.0 volts in one embodiment. For example, $V_g(Q2)$ may be held at about −2 volt. When the control FET 102 turns off, at time 206, the voltage potential at the switching node 126, will make a negative excursion towards a large negative value because of transient current from the inductor 120. When the switching node 126, which is also the drain of sync FET 112, falls just below a clamping voltage, ($V_{clamp}$) the channel begins to turn to an ON state (albeit weakly) and then the voltage at the switching node 126 will become clamped at the approximately value $V_{clamp}$. $V_{clamp}$ may be determined from:

$$V_{clamp}=V_{g(Q2)}-V_{fgd} \qquad \text{Eq. 3}$$

Where $V_{fgd}$ is the forward voltage of the gate-drain Schottky diode. In some embodiments, $V_g(Q2)$ is about −2V and $V_{fgd}$ is about −0.7 V. Thus, $V_{clamp}$ may be about −2.7 V.

The drain-source resistance 402 during conditions that obtain during the time interval between time 206 and time 216 may typically be about 5-10 times that of the $R_{ds(ON)}$ of the device. A typical resistance for $R_{ds(ON)}$ is about 10 milli-ohm. So, resistances on the order of 50-100 milli-ohm may describe the channel resistance $R_{ds}$.

A power dissipation during this time may be given by:

$$P_{clamp} = I_{Lp}^2 * R_{ds} * \frac{t_{dt}}{T} \qquad \text{Eq. 4}$$

Where $I_{Lp}$ is the peak value of the inductor current. The peak value of the inductor current $I_{Lp}$ may be calculated from an average current ($I_{La}$) of the inductor plus one half a ripple current ($L_{Lr}$), or $$I_{Lp}=I_{La}+(0.5*I_{Lr}) \qquad \text{Eq. 5}$$

For example, using some typical values in example embodiments:

$R_{ds}$=75 milliohms
$I_{Lp}$=23 A
$I_{La}$=20 A
$I_{Lr}$=6 A
$t_{cc}$=20 ns
T=1.33 us (a 750 kHz switching frequency)

and applying Eq. 4 and Eq. 5, the average power dissipated in the sync FET 112 is about 23 A²*0.075 ohm=600 mW. A voltage to which the drain of the sync FET 112 will be clamped may be calculated as:

$$V_{clamp}=I_{La}+(0.5*I_{Lr}*R_{ds})=-23*0.075=-1.75V.$$

Since minority carriers are not involved in this embodiment, there is little to no reverse recovery time involved.

A calculation of $P_{conduction}$, which is the power dissipated by sync FET 112 due to conduction during the ON state of the sync FET 112 may be calculated from the relation:

$$P_{conduction} = I_{La}^2 * R_{ds(ON)} * \frac{T_{ON(Q2)}}{T} \quad \text{Eq. 6}$$

If an input voltage $V_{in}$ of about 12 V and an output voltage of about 1 Vdc is assumed for one embodiment, then the duty cycle for the converter (the ON time interval 222 of the control FET 102) is about $\frac{1}{12}=0.083$. This means that the duty cycle for the Sync FET 112 is about $1-0.083=0.917$ (91.7%). That is also the time interval 228 that sync FET 112 is in the ON state divided by the total time interval T. Note that FIG. 2 is not to scale. Assuming typical values of:

$I_{La}=20$ A, $$\frac{T_{ON(Q2)}}{T} = 0.917$$

$R_{ds(ON)}=0.01$ ohm.

The conduction power during the ON state 228 of the sync FET 112 may be calculated from Eq. 6. In an example embodiment, using the values above, $P_{conduction}$ may be calculated to be $P_{conduction}=400*0.01*0.917=3.67$ W.

A compound semiconductor may have fast switching speeds compared to other commercially-available semiconductor switching devices. In some embodiments, these times may be 3 ns for the rise time and 1 ns for the fall time. The value of $P_{switching}$ is then given by $$P_{switching} = \left(0.5*I_{La}*V_{sw}*\frac{t_r}{T}\right) + \left(0.5*I_{La}*V_{sw}*\frac{t_f}{T}\right) \quad \text{Eq. 7}$$

Where $V_{sw}$ is the voltage at the switching node 126, determined from:

$V_{sw}=V_{clamp}-V_{conducting}$, and $V_{conducting}=I_{La}*R_{ds}(\text{on})$ and $V_{sw}=1.75-(23*0.01)=1.52$V Therefore, in can example embodiment, we can calculate the switching loss to be:

$P_{switching}=(0.5*23*1.52*0.003/1.33)+(0.5*23+1.52*0.001/1.33)=52$ mW.

A compound semiconductor FET may have a very low gate charge compared to other commercially-available semiconductor switching devices. In some embodiments, the gate charge is lower than about 1 nano-coulomb (nC). A typical gate charge for the sync FET 112 may be about 0.8 nC. For this example embodiment, the power loss due to gate drive associated with this charge may be calculated from the relation:

$P_{gate}=Q_g*V_g*f_{sw}$ Eq. 8

Where $Q_g$ is the total gate charge (e.g., 0.8 nC), $V_g$ is the total gate-source voltage deviation (e.g., +0.5 to $-2.0$V=2.5V) and $f_{sw}$ is the PWM switching frequency (e.g., 750 kHz). Given the above values, $P_{gate}=0.8*10^{-9}*2.5*750000=15$ mW.

In some embodiments, a total power dissipation of the sync FET 112 may be calculated from the relation:

$P_{total}=P_{clamp}+P_{conduction}+P_{gate}+P_{switching}$ Eq. 9

For the above examples, the total power may be calculated as $P_{total}=0.600+3.67+0.052+0.015=4.33$ W.

If an adequate copper etch layout and area are provisioned on an application printed circuit board for the sync FET 112, then this power dissipation can be safely accommodated by the device, resulting in a reliable operating temperature and high conversion efficiency.

Figure 5:
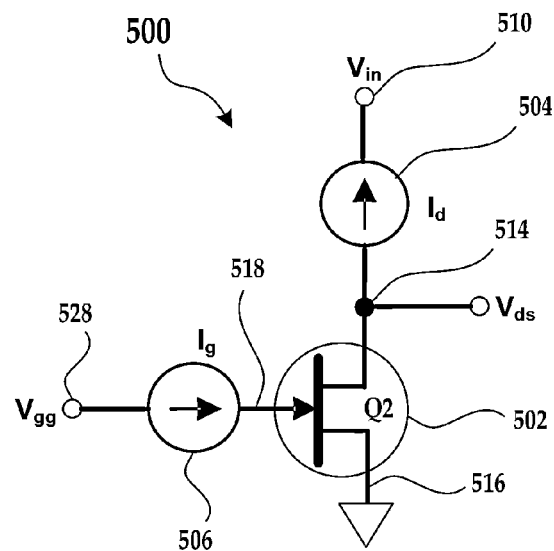
FIG. 5 illustrates a commutation configuration for a test circuit for measuring parameters of a depletion mode, compound semiconductor FET, in accordance with embodiments of the invention.

FIG. 5 illustrates a commutation configuration for a test circuit 500 for measuring parameters of a depletion mode, compound semiconductor FET 502, according to embodiments of the invention. The FET 502 includes a source 516 coupled to ground, a drain 514 coupled to a current source 504, and a gate 518 coupled to a gate voltage control 528 $V_{gg}$ fixed at $-2.00$ Volts. A voltage source 510 was set to $-5.0$V ($V_{in}$) and a fixed gate voltage of $-2.00$ Vdc was applied to the gate 518. The current source 504 applied a drain current (Id) from $-0.1$ to $-5.0$ amps to the drain 514. A drain-source voltage ($V_{ds}$) through the FET 502 was measured at the drain 514. A drain clamping voltage was determined to be about $-1.2$ volts.

A Table 1 illustrates experimental results using the circuit 500 illustrated in FIG. 5. The column labeled "$I_d$" shows the drain current in amps provided from the current source 504. The column labeled "$V_{ds}$" shows the drain-source voltage measured at the drain 514 relative to the source 516. The column labeled "$I_g$" shows the gate current in micro-amps through 506. The column labeled "Resistance" is the resistance in ohms of a channel through the FET 502 calculated from the drain current Id and the drain-source voltage $V_{ds}$. The column labeled "Power" is the power in watts calculated from the drain current Id and the drain-source voltage $V_{ds}$.

TABLE 1

| $I_d$ (A) | $V_{ds}$ (V) | $I_g$ (uA) | Resistance (Ohms) | Power (Watts) |
|---|---|---|---|---|
| −0.1 | −1.24 | 1.24 | 12.40 | 0.12 |
| −0.2 | −1.26 | 1.50 | 6.30 | 0.25 |
| −0.3 | −1.28 | 1.60 | 4.27 | 0.38 |
| −0.4 | −1.29 | 1.70 | 3.23 | 0.52 |
| −0.5 | −1.30 | 1.70 | 2.60 | 0.65 |
| −1.0 | −1.33 | 2.30 | 1.33 | 1.33 |
| −1.5 | −1.36 | 3.60 | 0.91 | 2.04 |
| −2.0 | −1.37 | 5.70 | 0.69 | 2.74 |
| −3.0 | −1.40 | 14.90 | 0.47 | 4.20 |
| −4.0 | −1.41 | 52.00 | 0.35 | 5.64 |
| −5.0 | −1.42 | 91.00 | 0.28 | 7.10 |

It was determined that for the FET 502, the drain clamping voltage breakpoint for low currents is about $-1.20$V, and that the channel resistance is about 37 milliohms. At low currents it appears that the gate 518 is not conducting current, thus, operation of the FET 502 is a result of a channel effect. However, as the drain current ($I_d$) increases, the drain-source voltage (Vas) increases in absolute value (becomes more negative) and approaches the magnitude of the gate voltage.

Accordingly, it can be seen that a compound semiconductor FET can be used to self-commutate transient currents during the dead time delay period and can result in safe, efficient and reliable circuit operation. In some embodiments, power losses incurred add approximately 0.6 W, which is about 20% to the circuit operation at an operating frequency of 750 kHz, an output voltage of 1.00 Vdc and a load current of 20 A.

The following are a set of examples of circuit design techniques for using a depletion mode compound semiconductor FET coupled to transient source for clamping transients:

In some embodiments, the ON/OFF swing of the gate-source voltage may be maintained at a smaller level for sync FET 112. A $V_{gs(OFF)}$ of −3V and a $V_{gs(ON)}$ of ≈0.2V may be used for a 20 A circuit application.

The $V_{gate}$ bias supply may be bypassed. A variety of low ESR ceramic capacitors (e.g. 0.1 uF, 0.01 uF, 0.001 uF and 100 pF) of at least 0805 size may be used to reduce the net impedance of the bypass capacitance below resonance during the time interval ($t_{dt}$.)

A shorter time interval $t_{dt}$ may reduce switching power. The compound semiconductor FET may have very fast switching times. In some embodiments, $t_{ON}$ and $t_{OFF}$ are less than 5 ns. In some embodiments it is possible to reduce the dead time interval, $t_{dt}$, to less than 10 ns.

Reducing the clamping losses to less than 750 mW by minimizing $V_{clamp}$ and $t_{dt}$ may help to avoid thermal damage to the device and insure reliable operation.

The circuit 100 is configured as an output stage for a DC-DC convertor including an inductor and is illustrative of use of a compound semiconductor FET in a circuit including transient sources. However, other circuits that include transient sources may include a compound semiconductor FET for suppressing and/or clamping transients.

Figure 6:
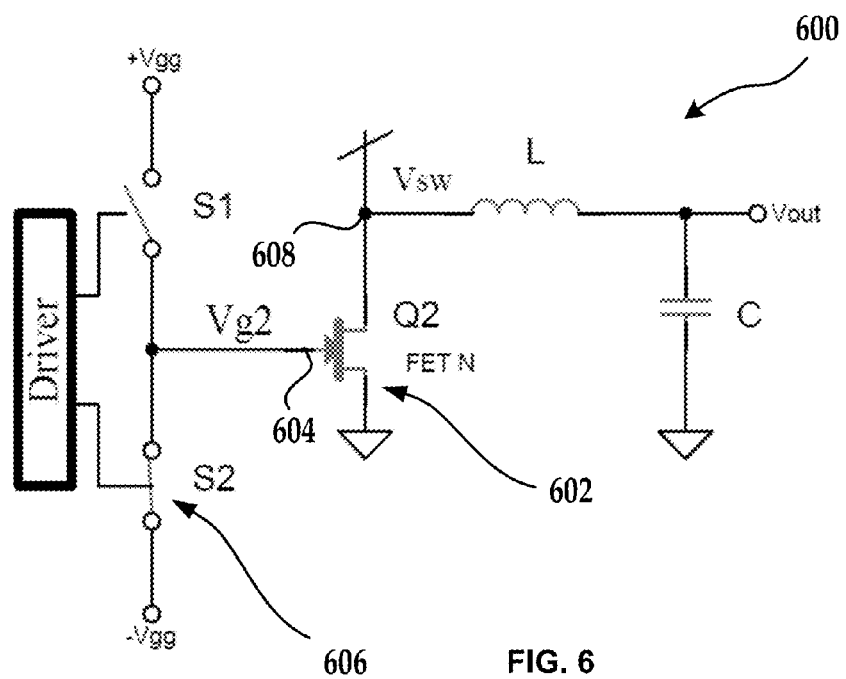
FIG. 6 is a block diagram illustrating an alternative embodiment of a circuit for a synchronous CSFET active clamp in accordance with various embodiments of the invention.

FIG. 6 is a block diagram illustrating an alternative embodiment of a circuit 600 for a synchronous CSFET active clamp 602 in accordance with various embodiments of the invention. The circuit 600 of FIG. 6 uses a fixed negative gate bias (−Vgg) at gate 604, which is provided by a semiconductor switch 606 (S2) to achieve a clamping level at the switching node 608 (Vsw).

Figure 7:
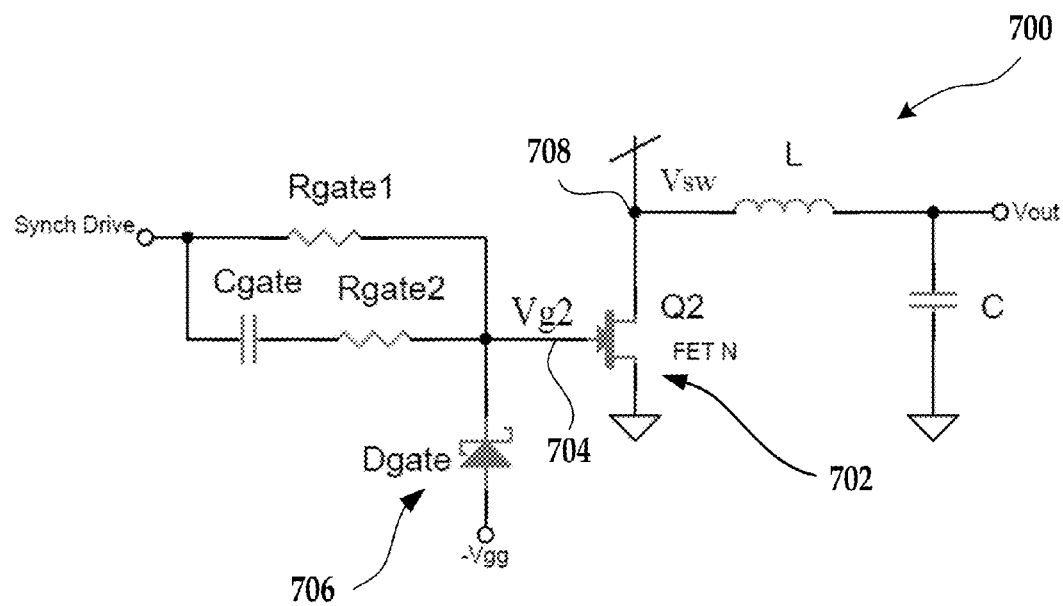
FIG. 7 is a block diagram illustrating an alternative embodiment of a circuit for a synchronous CSFET active clamp, in accordance with various embodiments of the invention.

FIG. 7 is a block diagram illustrating an alternative embodiment of a circuit 700 for a synchronous CSFET active clamp 702, in accordance with various embodiments of the invention. The circuit 700 of FIG. 7 uses a gate-side negative gate bias (−Vgg) provided to the gate 704 using a Schottky diode at clamping diode 706 (Dgate) to achieve a clamping level at the switching node 708 (Vsw).

Figure 8:
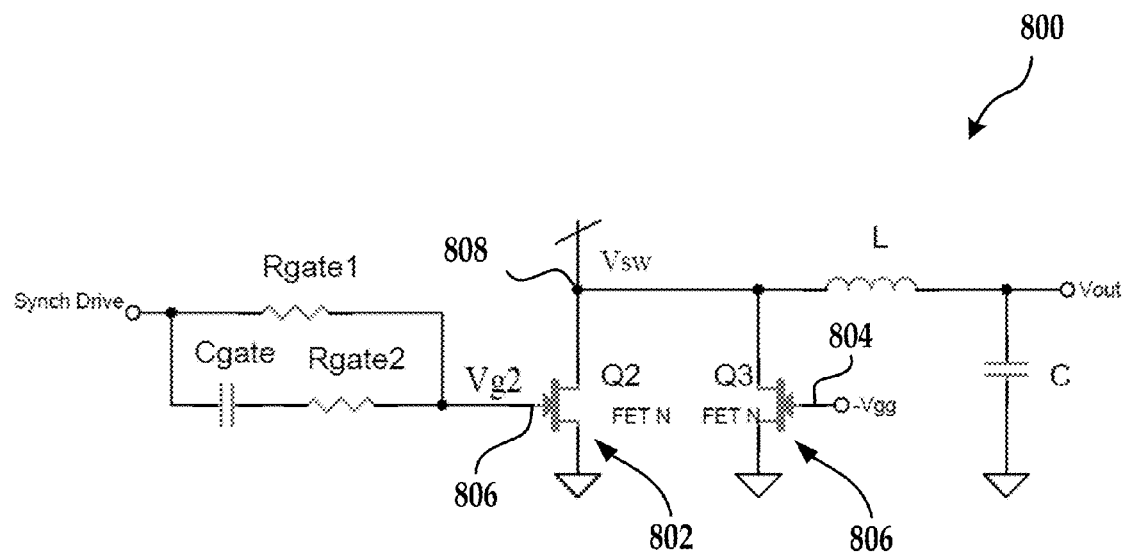
FIG. 8 is a block diagram illustrating an alternative embodiment of a circuit for a synchronous CSFET active clamp, in accordance with various embodiments of the invention.

FIG. 8 is a block diagram illustrating an alternative embodiment of a circuit 800 for a synchronous CSFET active clamp 806, in accordance with various embodiments of the invention. The circuit 800 of FIG. 8 uses a second compound semiconductor device for the active CSFET 806 (Q3) in parallel with a synchronous switch device 802 (Q2). The active clamp CSFET 806 is configured to achieve a clamping level at the switching node 808 (Vsw). The active clamp CSFET 806 may be provisioned with a fixed negative gate bias (−Vgg) at gate 804 and may be provisioned to freely switch ON/OFF such that a clamping function is decoupled from the synchronous switch device 802. The embodiment illustrated in FIG. 8 may be useful for reducing power losses due to the synchronous switch device 802.

Figure 9:
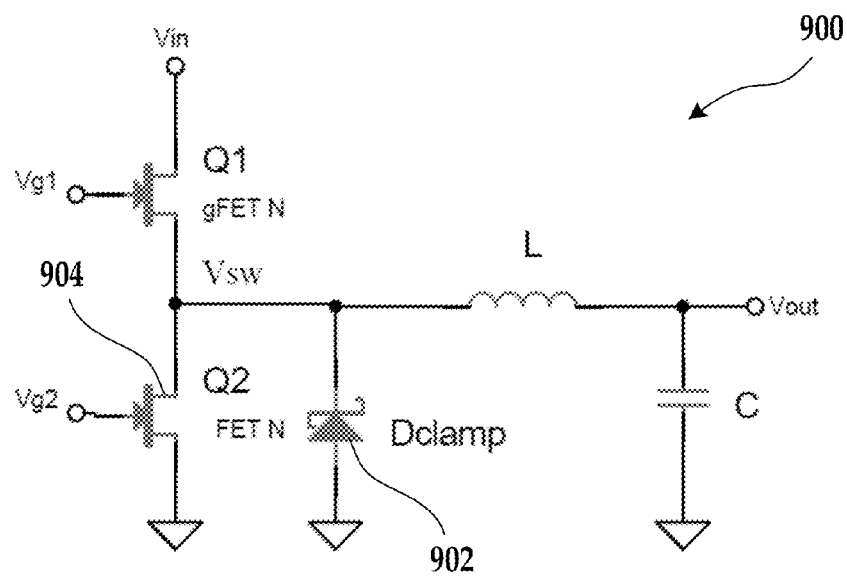
FIG. 9 is a block diagram illustrating an alternative embodiment of a buck DC-DC converter output stage.

FIG. 9 is a block diagram illustrating an alternative embodiment of a buck DC-DC converter output stage 900 using a compound semiconductor FET for device 904 and blocking diode 902. The FET 904 may be configured as an enhancement mode compound semiconductor device or a depletion mode compound semiconductor device. A compound semiconductor FET such as a GaAs FET is generally not used for device 904 in rectified step-down buck DC-DC converter circuits 900 or other circuits that include transient sources such as inductors because a GaAs FET does not include an intrinsic body diode for blocking current surges.

When the FET 904 is configured as a compound semiconductor enhancement mode device, the blocking diode 902 may be used to clamp transient signals. In some embodiments, a blocking diode 902 may be provisioned in a CSFET during fabrication of the device 904. Similarly, a blocking diode 902 may be used as an additional component in the circuit design 900. However, these alternatives may result in increased cost, complexity, size, and parts count of the circuit 900.

In the example of a synchronously-rectified DC-DC buck converter a compound semiconductor FET fabricated as a depletion mode device may be used in a sync FET position to clamp transient signals. Additionally, another compound semiconductor FET fabricated as an enhancement mode device may be used in a control FET position to block current during startup.

Figure 10:
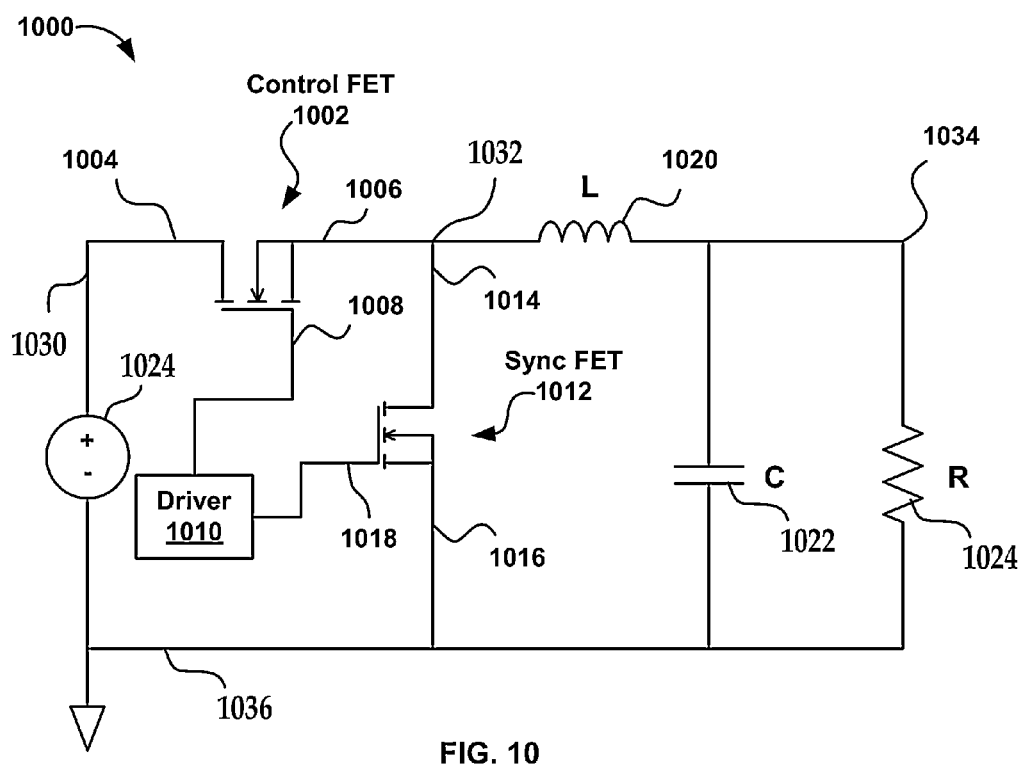
FIG. 10 illustrates a block diagram of a circuit for a synchronously-rectified power stage of a DC-DC converter using compound semiconductor FETs, in accordance with embodiments of the invention.

Compound semiconductor FET switches may be used in applications such as dc-dc voltage converters. FIG. 10 illustrates a block diagram of a circuit 1000 for a synchronously-rectified power stage of a DC-DC converter using compound semiconductor FETs, in accordance with embodiments of the invention. An example of a circuit in FIG. 10 includes a buck converter, which is a DC-DC voltage converter that may use such compound switch devices. The circuit of FIG. 10 includes a voltage source 1024, a control FET 1002, a sync FET 1012, a driver 1010, an inductor 1020, an optional capacitor 1022 and a load 1024. When an input voltage from voltage source 1024 (Vin) is initially applied to the circuit 1000, the driver 1010 may use some finite delay time to power up before the driver 1010 can actively control a gate 1008 of the control FET 1002 and a gate 1018 of the sync FET 1012. During that delay time there may be no voltage applied to the gates 1008 and 1018 of the control FET switch 1002 and sync FET switch 1012, respectively. If the control FET switch 1002 and sync FET switch remain in an OFF state while no voltage is applied to the respective gates, the FETs 1002 and 1012 will not conduct current from the input at 1030 to the output at 1034, node 1032, or to ground at 1036. The load 1034 is represented by a resistance R. However, in various embodiments, the load 1034 includes active components, passive components, semiconductor devices, and/or the like. Thus the system's control electronics may be powered up and actively controlling the FET switches 1002 and 1012 before any current can pass through the converter 1000 in an uncontrolled manner. Such uncontrolled current conduction could cause damage to circuits such as the load 1034 connected to the output at 1034 and/or would waste energy by allowing current to flow through both devices directly to ground.

Compound semiconductor FET switches may be fabricated as a normally-off (also known as an enhancement-mode, or E-mode) device, such as the control FET 1002. An enhancement mode FET device may function similarly to MOSFET devices. However, an enhancement mode FET operates at lower voltages than does a MOSFET counterpart. For example, the control FET may initially begin to switch to an ON state at about 0.2 volts and may be fully in a fully ON state (at about 1.0 volts).

Alternatively, compound semiconductor switches may be fabricated as a normally-on (depletion-mode, or D-mode) device, such as the sync FET 1012. As discussed above, a depletion mode FET device is normally on when zero or no voltage is applied to its gate electrode. It uses a negative gate voltage to switch to an OFF state. For example, the sync FET 1012 may begin to switch to an OFF state at about −0.2 volts and may be in a fully OFF state at about −1.0 volts applied to the gate 1018. The sync FET 1012 may be in a fully on state at about +0.4 volts applied to the gate 1018. Thus, if the converter circuit 1000 were assembled using D-mode devices for both FET switch 1002 and 1012, it would be inherently uncontrolled upon system turn-on and would conduct current in an uncontrolled and potentially wasteful and/or damaging fashion before the driver 1010 can apply proper voltages to the gates 1008 and 1018. Additional circuitry may be used to prevent damage during startup phase. Unfortunately, such circuitry increases cost and size of devices.

However, a compound semiconductor FET fabricated as a D-mode device has advantages over a similar compound semiconductor fabricated as an E-mode device. For example, a D-mode compound semiconductor FET switch can be fabricated in a smaller overall footprint than a similar E-mode version for a given maximum on-resistance. Thus, a D-mode compound semiconductor FET switch may be less expensive to manufacture than a similar E-mode equivalent. Moreover, as discussed above, a D-mode compound semiconductor FET switch can be used without a parallel clamping diode that is normally required with E-mode devices.

In normal operation the two FET switches 1002 and 1012 in the buck converter circuit 1000 alternate being in the ON state. When the control FET 1002 is in the ON state, and the sync FET switch 1012 is the OFF state, current passes through the control FET switch 1002 and the inductor 1020/capacitor 1022 network to the output 1034 of the converter circuit 1000. When the control FET switch 1002 is switched to the OFF state there is a delay before the sync FET switch 1012 switches to the ON state. This delay may be due to a finite time it takes for the gate 1018 to respond to the switch command from the driver circuit 1010.

During this delay the charge built up in the inductor 1020 and capacitor 1022 (the L-C output network) may cause a large negative voltage spike to occur at node 1032. A zener diode not shown may be used in the circuit 1000 in parallel to the sync FET switch 1012 such that when the negative voltage at the node 1032 becomes larger than the threshold voltage of the zener diode the diode will turn on and conduct the current to ground limiting the size of the negative voltage spike.

An example of a zener diode in a MOSFET is known as a body diode. The body diode in the MOSFET switch ultimately accounts for a significant amount of wasted energy as it conducts current to ground due to its relatively large resistance.

The FET switch 1012 that is fabricated as a depletion mode device, on the other hand, may function without a body diode. As above, the negative voltage at node 1032 will have the effect of self-biasing the gate 1018 to be partially on thus allowing the charge stored in the L-C network to be conducted through the much lower resistance of the sync FET switch 1012 until the control electronics switches the sync FET switch 1012 to a fully ON state. Thus the need for a separate electrical path (the body diode) is eliminated, resulting in less energy being wasted in the discharge process. However, this same self-biasing effect cannot be achieved in a FET switch fabricated as an enhancement mode device, which is a normally off device.

The control benefits of the normally-off devices along with the smaller size and lower losses from eliminating the body diode in normally-on devices may be achieved using a dual-mode FET switch device. In a dual mode device, the control FET switch 1002 may be configured as an E-mode device (normally off) and the sync FET switch 1012 may be configured as a D-mode device (normally on). In the normally off state, the control FET switch 1002 may block the flow of current into the converter circuit 1000 during a start-up phase thus avoiding any wasted energy or potential start-up damage. The sync FET switch 1012 as a D-mode device, may be smaller for a given on-resistance and may eliminate a need for a separate body diode. Thus, additional circuitry need not be used to prevent damage during startup phase.

The control FET switch 1002 as an E-mode device may be somewhat larger than the sync FET switch 1012 as a D-mode device, and thus slightly intrinsically more expensive to manufacture, for a given ON state resistance. However, at large voltage conversion ratios (e.g., 12 volts to 1.2 volts) used in many buck converters, the control FET switch 1002 conducts current for a small fraction of each cycle, approximately $V_o/V_{in}$. For example, for a Vin=12 volts and a Vout=1 volt, the control FET switch 1002 may conduct current for about 1/12 of each cycle. Thus, while the control FET switch 1002 may be made to be slightly more resistive (and thus comparable in size to what its D-mode counterpart would have been) there would be little impact on the overall conversion efficiency and performance of the converter circuit 1000.

Conversely, since the sync FET switch 1012 is on during a larger percentage of each cycle than the control FET switch 1002, the sync FET switch 1012 may have a low ON state resistance which can be achieved in a smaller footprint with a D-mode device than a counterpart E-mode device having an equivalent ON state resistance. Thus, the sync FET switch 1012 may be fabricated as a D-mode device while avoiding the potential problems of such devices.

As used in this specification, the terms "include," "including," "for example," "exemplary," "e.g.," and variations thereof, are not intended to be terms of limitation, but rather are intended to be followed by the words "without limitation" or by words with a similar meaning. Definitions in this specification, and all headers, titles and subtitles, are intended to be descriptive and illustrative with the goal of facilitating comprehension, but are not intended to be limiting with respect to the scope of the inventions as recited in the claims. Each such definition is intended to also capture additional equivalent items, technologies or terms that would be known or would become known to a person having ordinary skill in this art as equivalent or otherwise interchangeable with the respective item, technology or term so defined. Unless otherwise required by the context, the verb "may" indicates a possibility that the respective action, step or implementation may be performed or achieved, but is not intended to establish a requirement that such action, step or implementation must be performed or must occur, or that the respective action, step or implementation must be performed or achieved in the exact manner described.

The above description is illustrative and not restrictive. This patent describes in detail various embodiments and implementations of the present invention, and the present invention is open to additional embodiments and implementations, further modifications, and alternative constructions. There is no intention in this patent to limit the invention to the particular embodiments and implementations disclosed; on the contrary, this patent is intended to cover all modifications, equivalents and alternative embodiments and implementations that fall within the scope of the claims. Moreover, embodiments illustrated in the figures may be used in various combinations. Any limitations of the invention should, therefore, be determined not with reference to the above description, but instead should be determined with reference to the appended claims along with their full scope of equivalents.

What is claimed is:

1. A power converter circuit comprising:
   a depletion mode control Field Effect Transistor (FET) fabricated using compound semiconductor;
   an enhancement mode sync FET fabricated using the compound semiconductor, a drain of the sync FET coupled to a source of the control FET; and an inductor coupled to the source of the control FET and the drain of the sync FET.

2. The converter circuit of claim 1, wherein the converter circuit is configured as a buck converter circuit.

3. The converter circuit of claim 1, wherein the control FET and the sync FET are disposed on a single piece of gallium arsenide or gallium nitride.

4. The converter circuit of claim 1, further comprising a driver circuit configured to switch the sync FET on and then switch the control FET off upon applying power to the converter circuit.

5. The converter circuit of claim 4, wherein the driver circuit, the control FET and the sync FET are fabricated on a single piece of gallium arsenide.

6. The converter circuit of claim 4, wherein the sync FET is further configured to operate independent of a body diode disposed within a substrate of the sync FET.

7. The converter circuit of claim 1, wherein the sync FET clamps voltage at the drain of the sync FET independently of a clamping diode between the source and the drain of the sync FET.

8. The converter circuit of claim 1, wherein the control FET and the sync FET are disposed on GaAs, Si, SiC, Sapphire, InP, or gallium nitride.

9. A converter circuit comprising:
an inductor;
a control FET configured as an enhancement mode device, a source of the control FET coupled to the inductor; and
a sync FET configured as a depletion mode device, the control FET and the sync FET fabricated using a single compound semiconductor substrate, a drain of the sync FET coupled to the inductor and the source of the control FET.

10. The converter circuit of claim 9, wherein the converter circuit is configured as a buck converter circuit.

11. The converter circuit of claim 9, wherein a channel between the drain and a source of the sync FET is configured to clamp voltage from the inductor independent of a clamping diode.

12. The converter circuit of claim 9, wherein the sync FET does not include a clamping diode between the source and the drain of the sync FET.

13. The converter circuit of claim 9, further comprising a driver circuit configured to switch the sync FET off upon power-up of the converter circuit before the control FET is on.

14. The converter circuit of claim 13, wherein the driver circuit is fabricated on the single compound semiconductor substrate.

15. The converter circuit of claim 13, wherein the driver circuit is fabricated on a silicon substrate.

16. The converter circuit of claim 9, wherein the compound semiconductor used to create the control and sync FET is one of GaAs, Si, SiC, Sapphire, InP, or gallium nitride.

17. A method for fabricating a converter circuit, the method comprising:
fabricating a control FET as an enhancement mode device on a semiconductor layer;
fabricating a sync FET as a depletion mode device on a compound semiconductor layer; and
coupling a contact to a source of the control FET and to a drain of the sync FET, the contact configured for coupling to an inductor.

18. The method of claim 17, wherein the control FET is fabricated on a silicon substrate and the sync FET is fabricated on a compound semiconductor substrate of either gallium arsenide or gallium nitride.

19. The method of claim 17, further comprising coupling a driver circuit to a gate of the control FET and a gate of the sync FET, the driver circuit configured to switch the sync FET off upon powering up the converter circuit before switching the control FET on.

20. The method of claim 17, further comprising fabricating the driver circuit on the compound semiconductor layer with the control FET and the sync FET.

21. The method of claim 17, further comprising fabricating the sync FET without a clamping diode between the source and the drain of the sync FET.

22. The method of claim 17, wherein the control FET is fabricated on a silicon substrate and the sync FET is fabricated on a compound semiconductor substrate of GaAs, Si, SiC, Sapphire, InP, or gallium nitride.

23. A power converter circuit comprising:
a control (FET) fabricated on a semiconductor;
a sync FET fabricated as a depletion mode device using a compound semiconductor, a drain of the sync FET coupled to a source of the control FET; and
an inductor coupled to the source of the control FET and the drain of the sync FET.

24. The converter circuit of claim 23, further comprising a clamping diode between the source and the drain of the sync FET, the clamping diode provisioned in the compound semiconductor of the sync FET during fabrication.

25. The converter circuit of claim 23, further comprising a controller configured to protect the power converter during turn-on.

26. A power converter circuit comprising:
a control FET fabricated as a depletion mode device using a compound semiconductor;
a sync FET fabricated as a depletion mode device using the compound semiconductor, a drain of the sync FET coupled to a source of the control FET; and
an inductor coupled to the source of the control FET and the drain of the sync FET.

27. The converter circuit of claim 26, further comprising a controller configured to protect the power converter during turn-on.

28. The converter circuit of claim 26, further comprising a clamping diode between the source and the drain of the sync FET.

29. The converter circuit of claim 28, wherein the clamping diode is provisioned in the compound semiconductor during fabrication.

* * * * *